(12) United States Patent
Nakanishi et al.

(10) Patent No.: US 7,746,662 B2
(45) Date of Patent: Jun. 29, 2010

(54) TOUCH PANEL

(75) Inventors: Akira Nakanishi, Fukui (JP); Shigeyuki Fujii, Fukui (JP)

(73) Assignee: Panasonic Corporation, Osaka (JP)

( * ) Notice: Subject to any disclaimer, the term of this patent is extended or adjusted under 35 U.S.C. 154(b) by 246 days.

(21) Appl. No.: 11/640,867

(22) Filed: Dec. 19, 2006

(65) Prior Publication Data
US 2007/0139393 A1 Jun. 21, 2007

(30) Foreign Application Priority Data
Dec. 19, 2005 (JP) ............... 2005-364590

(51) Int. Cl.
H05K 7/00 (2006.01)
(52) U.S. Cl. ...................... 361/782; 174/259
(58) Field of Classification Search ......... 361/749–752, 361/782; 174/258, 259, 260; 345/173–179
See application file for complete search history.

(56) References Cited

U.S. PATENT DOCUMENTS

| | | | | |
|---|---|---|---|---|
| 5,084,961 | A * | 2/1992 | Yoshikawa | 29/840 |
| 5,799,392 | A * | 9/1998 | Mishiro | 29/830 |
| 6,097,610 | A | 8/2000 | Hashimoto | |
| 6,504,530 | B1 * | 1/2003 | Wilson et al. | 345/173 |
| 6,952,250 | B2 * | 10/2005 | Ueda | 349/150 |
| 7,215,329 | B2 * | 5/2007 | Yoshikawa et al. | 345/173 |
| 2002/0014518 | A1 * | 2/2002 | Totani et al. | 228/180.1 |
| 2005/0219230 | A1 | 10/2005 | Nakayama et al. | |
| 2006/0097991 | A1 * | 5/2006 | Hotelling et al. | 345/173 |

FOREIGN PATENT DOCUMENTS

| | | |
|---|---|---|
| CN | 1262784 | 8/2000 |
| CN | 1680907 | 10/2005 |
| JP | 2003-58319 A | 2/2003 |

OTHER PUBLICATIONS

Chinese Office Action, with English Translation, issued in corresponding Chinese Patent Application No. CN 200610166960.0, issued on Jan. 18, 2008.

* cited by examiner

Primary Examiner—Jeremy C Norris
Assistant Examiner—Yuriy Semenenko
(74) Attorney, Agent, or Firm—McDermott Will & Emery LLP

(57) ABSTRACT

A touch panel includes a light-transmissible upper board, a lower board, an upper resistor layer on a lower surface of the upper board, a lower resistor layer provided on an upper surface of the lower board and facing the upper resistor layer with a predetermined space between the resistor layers, a wiring board having an end located between the upper board and the lower board, plural wiring patterns provided on the wiring board and connected to the upper resistor layer and the lower resistor layer, respectively, and an insulating cover sheet provided on the wiring board and covering the wiring patterns. The cover sheet extends to an inside beyond at least one of respective ends of the upper board and the lower board. This touch panel can be electrically connected to an electronic circuit stably.

7 Claims, 3 Drawing Sheets

TOUCH PANEL

TECHNICAL FIELD

The present invention relates to a touch panel used for an operation of various electronic devices.

BACKGROUND ART

An electronic device, such as a mobile phone and a car navigation system, has had higher performance and various functions, and often includes a light-transmissible touch panel attached onto a front surface of a display element, such as a liquid crystal display. An operator presses the touch panel with a finger or a pen while looking at the display element through the touch panel, thereby switching the functions to operate the device. This touch panel is demanded to be reliably operated and not to prevent the operator from looking at the display element.

FIGS. 4 and 5 are a side sectional view and a plane sectional view of conventional touch panel 5001, respectively. Upper board 501 has a film shape and is light-transmissible. Light-transmissible upper resistor layer 503 made of resistor material, such as indium tin oxide, is provided on a lower surface of upper board 501. Lower resistor layer 504 is provided on an upper surface of light-transmissible lower board 502. Plural dot spacers made of insulating resin are arranged on an upper surface of lower resistor layer 504 by predetermined intervals. Pair of upper electrodes are provided at both ends of upper resistor layer 503, respectively. Pair of lower electrodes 505 are provided at both ends of lower resistor layer 504 and arranged in a direction orthogonal to a direction along which the pair of upper electrodes are arranged.

Spacer 505 having a substantial frame shape is provided on an outer periphery of a lower surface of upper board 501 or on an outer periphery of an upper surface of lower board 502. An upper surface and a lower surface of spacer 505 are coated with adhesion layers causing the upper and lower surfaces of spacer 505 to adhere onto an outer periphery of upper board 501 and an outer periphery of lower board 502, respectively.

Wiring board 506 having a film shape has a lower surface having wiring patterns 507 formed thereon. Wiring patterns 507 are made of copper and plated with nickel or gold. Cover sheet 508 having a film shape is adhered onto the lower surface of wiring board 506 so as to cover the surfaces of wiring patterns 507 other than the left and right end portions of the wiring patterns.

The left end of wiring board 506 is sandwiched between upper board 501 and lower board 502. Anisotropic conductive adhesive 509 allows end portions of an upper electrode and a lower electrode extending to the upper surface of lower board 502 to adhere to left end portions of wiring patterns 507, respectively, thus, electrically connecting wiring patterns 507 to both ends of upper resistor layer 503 and lower resistor layer 504 via the upper electrode and the lower electrode. Anisotropic conductive adhesive 509 includes synthetic resin and conductive particles dispersed in the synthetic resin.

Adhesive 510 is made of resin, such as acryl or rubber, and is coated onto upper board 501 and the right end of lower board 502. Adhesive 510 is allows wiring board 506 to adhere and fix to upper board 501 and lower board 502, thus providing touch panel 5001.

Touch panel 5001 is provided on a display surface of a display device, such as a liquid crystal display, thus being attached to an electronic device. Wiring board 506 is bent downward to allow the right end thereof to be connected to an electronic circuit of the electronic device, for example, with a connector or by soldering.

An operator presses the upper surface of upper board 501 with a finger or a pen while looking at the display surface of the display element through the touch panel. Then, upper board 501 accordingly sags locally to cause upper resistor layer 503 at a pressed portion to contact lower resistor layer 504.

The electronic circuit of the electronic device alternately applies a voltage to upper resistor layer 503 and lower resistor layer 504 via wiring patterns 507. The electronic circuit detects a voltage of the resistor layer to which the voltage is applied through the resistor layer to which the voltage is not applied, calculates the position of the pressed portion based on the detected voltage, and switches functions to control the device according to the position.

In conventional touch panel 5001, wiring board 506 is bent in direction D501, as shown in FIG. 4, in order to connect the right end portion of wiring pattern 507 to the electronic circuit of the device. While wiring pattern 507 is fixed with adhesive 510, a stress concentrates to portion P501 near the left end of cover sheet 508 of wiring pattern 507, and may cause portion P501 of wiring pattern 507 to have crack or breakage. This may cause unstable electrical connection between touch panel 5001 and the electronic circuit.

SUMMARY OF THE INVENTION

A touch panel includes a light-transmissible upper board, a lower board, an upper resistor layer on a lower surface of the upper board, a lower resistor layer provided on an upper surface of the lower board and facing the upper resistor layer with a predetermined space between the resistor layers, a wiring board having an end located between the upper board and the lower board, plural wiring patterns provided on the wiring board and connected to the upper resistor layer and the lower resistor layer, respectively, and an insulating cover sheet provided on the wiring board and covering the wiring patterns. The cover sheet extends to an inside beyond at least one of respective ends of the upper board and the lower board.

This touch panel can be electrically connected to an electronic circuit stably.

DETAILED DESCRIPTION OF PREFERRED EMBODIMENTS

Figure 1:
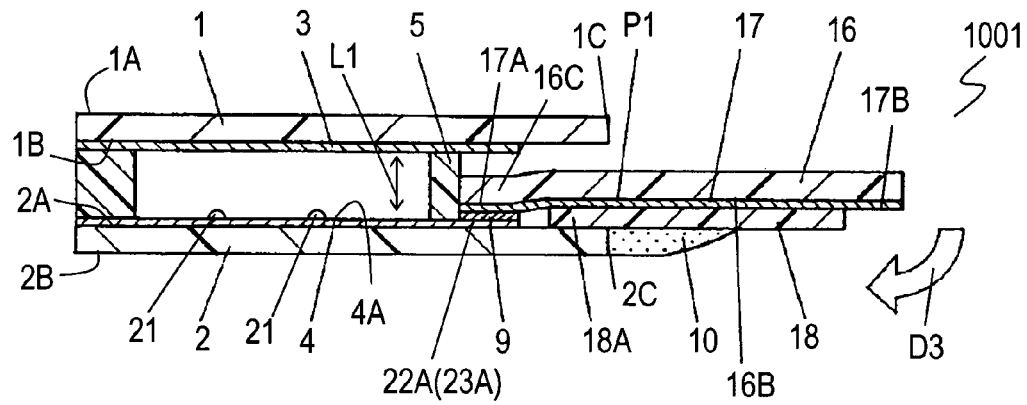
FIG. 1 is a side sectional view of a touch panel of an exemplary embodiment of the present invention.
Figure 2:
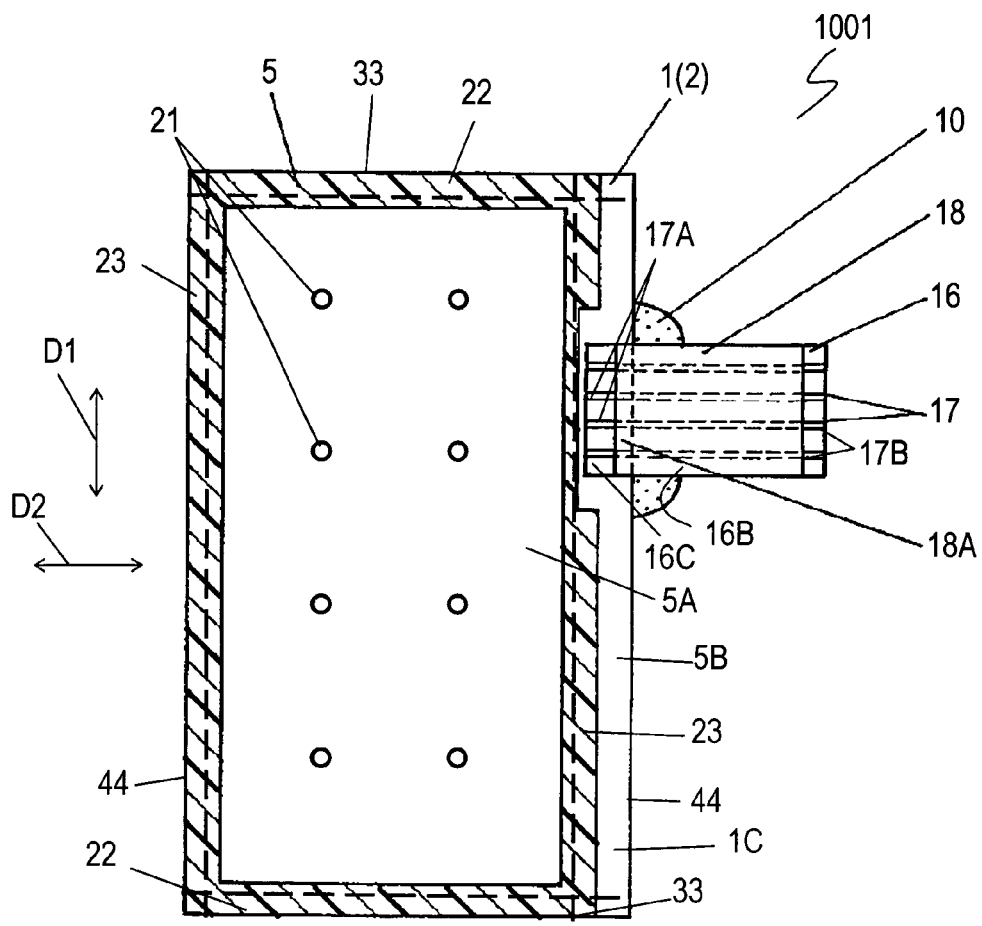
FIG. 2 is a plane sectional view of the touch panel according to the embodiment.

FIGS. 1 and 2 are a side sectional view and a plane sectional view of touch panel 1001 according to an exemplary embodiment of the present invention, respectively. Upper board 1 is light-transmissible and made of film, such as polyethylene terephthalate film or polycarbonate film. Lower board 2 is light-transmissible and is made of a plate, such as a glass plate, an acryl plate, polyethylene terephthalate plate, or a polycarbonate plate. Upper resistor layer 3 made of light-transmissible resistor material, such as indium tin oxide or tin oxide, is provided on lower surface 1B of upper board 1 by, for example, a sputter method. Lower resistor layer 4 made of resistor material, such as indium tin oxide or tin oxides is provided on upper surface 2A of lower board 2 by, for example, the sputter method.

Dot spacers 21 made of insulating resin, such as epoxy or silicone, are formed on upper surface 4A of lower resistor layer 4 with predetermined intervals. Upper electrodes 21 made of conductive material, such as silver or carbon, are formed at both ends of lower resistor layer 4 arranged in direction D1 of upper resistor layer 3, respectively. Lower electrodes 22 are formed at both ends 44 of upper resistor layer 4, respectively. Both ends 44 of lower resistor layer 4 are arranged in direction D2 orthogonal to direction D1 along which both ends 33 of upper resistor layer 3 are arranged.

Spacer 5 is made of inelastic resin, such as non-woven fabric, epoxy, acryl, or polyester, and has a substantial frame shape. Spacer 5 is provided between an outer periphery of lower surface 1B of upper board 1 and an outer periphery of upper surface 2A of lower board 2, thus separating inner region 5A of the substantial frame shape from outer region 5B. Adhesives coated onto upper and lower surfaces of spacer 5 allow spacer 5 to adhered onto the outer periphery of upper board 1 and the outer periphery of lower board 2, thus allowing upper resistor layer 3 to face lower resistor layer 4 with predetermined space L1 between the layers.

Wiring board 16 is made of film, such as polyethylene terephthalate film, polyimide film, or polycarbonate film, and has a thickness ranging from 20 μm to 50 μm. Wiring patterns 17 are provided on lower surface 16B of wiring board 16. Wiring pattern 17 includes a copper foil having a thickness of about 20 μm, a nickel layer provided on the copper foil and having a thickness ranging from about 1 μm to 10 μm, and a gold layer provided on the nickel layer and having a thickness ranging from about 0.03 μm to 0.3 μm. The nickel layer and the gold layer are formed by, for example, plating.

Insulating cover sheet 18 having a film shape and a thickness ranging from 20 μm to 50 μm is provided on lower surface 16B of wiring board 16. Cover sheet 18 exposes end portions 17A and 17B of wiring pattern 17, and thus covers the surface of wiring pattern 17 other than end portions 17A and 17B. End 16C of wiring board 16 is sandwiched between upper board 1 and lower board. End 18A of cover sheet 18 extends to an inside beyond at least one of end 1C of upper board 1 and end 2C of lower board 2.

End portions 22A and 23A of upper electrode 22 and lower electrode 23 extend to upper surface 2A of lower board 2 at outer region 5B of spacer 5. Anisotropic conductive adhesives 9 allow end portion 22A of upper electrode 22 and end portion 23A of lower electrode 23 to adhere to and be connected to end portions 17A of wiring patterns 17, respectively. Wiring patterns 17 are electrically connected to both ends 33 of upper resistor layer 3 and both ends 44 of lower resistor layer 4 via upper electrode 22 and lower electrode 23, respectively. Anisotropic conductive adhesive 9 includes synthetic resin, such as polyester or chloroprene rubber, and conductive particles dispersed in the synthetic resin. The conductive particles may be nickel particles or resin particles having surfaces plated with gold.

Adhesive 10 is made of silicone, chloroprene, urethane rubber, acryl, or mixture thereof. Adhesive 10 allow cover sheet 18 to adhere to lower board 2. Adhesive 10 may allow cover sheet 18 to adhere to upper board 1.

Touch panel 1001 is provided on a display surface of a display device, such as apparatus a liquid crystal display, thus attached to an electronic device. As shown in FIG. 1, wiring board 16 is bent in direction D3 toward lower board 2, and end portion 17B of wiring pattern 17 is connected to an electronic circuit of the electronic device, for example, with a connector or by soldering. End 18A of cover sheet 18 adhering to lower surface 16B of wiring board 16 extends to an inside beyond at least one of end 1C of upper board 1 and end 2C of lower board 2. This structure allows portion P1 of wiring pattern 17 having a stress concentrating thereto due to the bending of wiring board 16 in direction D3 to be sandwiched between wiring board 16 and cover sheet 18. This structure reduces the stress applied to wiring pattern 17, accordingly preventing portion 17A of wiring pattern 17 from having a crack or breakage.

An operator presses upper surface 1A of upper board 1 with a finger or a pen while looking at the display surface of the display device through touch panel 1001. Upper board 1 accordingly sags locally to cause a portion of upper resistor layer 3 corresponding to the pressed portion of upper board 1 to contact lower resistor layer 4.

The electronic circuit alternately applies a voltage between both ends 33 of upper resistor layer 3 and between both ends 44 of lower resistor layer 4 via wiring patterns 17 of wiring board 16. The electronic circuit detects a voltage of the resistor layer out of upper resistor layer 3 and lower resistor layer 4 to which the voltage is applied via the resistor layer to which the voltage is not applied. The electronic circuit calculates the position of the pressed portion based on the detected voltage, and switches functions of the electronic device based on the calculated position.

In touch panel 1001, portion P1 of wiring pattern 17 to which the stress due to the bending of wiring board 16 in direction D3 concentrates is covered with cover sheet 18 to reduce the stress, thereby preventing wiring pattern 17 from having a crack or breakage. Touch panel 1001 can be electrically connected to the electronic circuit stably and can be operated reliably.

Adhesive 10 applied between lower board 2 and lower surface 16B of wiring board 16 prevents wiring pattern 17 from having a crack or breakage when wiring board 16 is bent in direction D3

Figure 3:
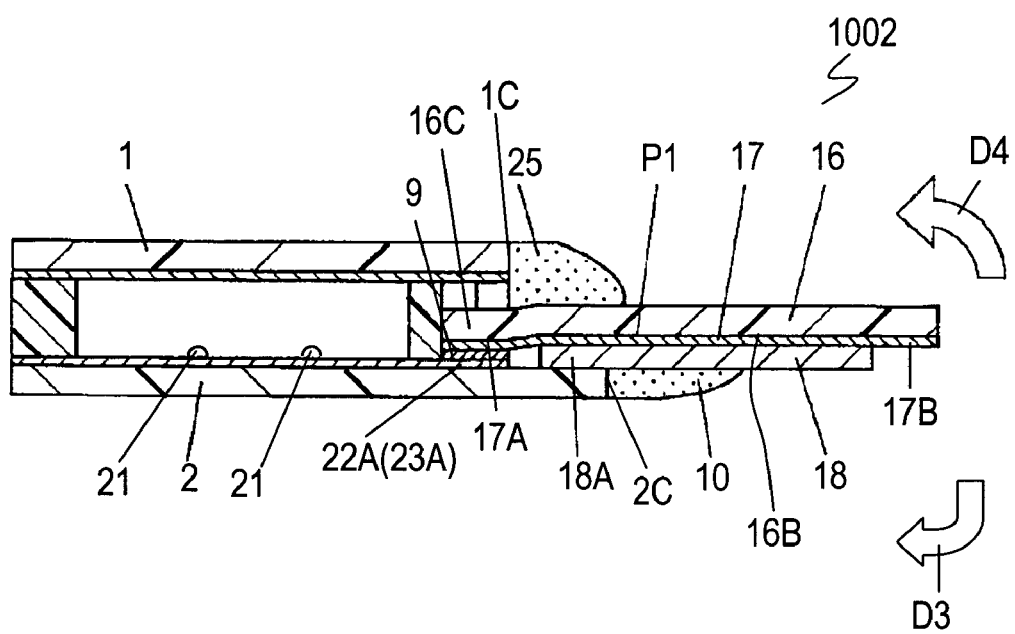
FIG. 3 is a side sectional view of another touch panel according to the embodiment.
Figure 4:
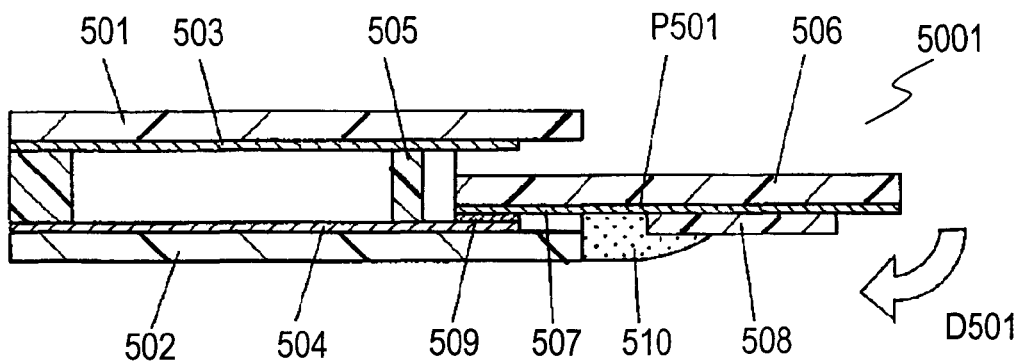
FIG. 4 is a side sectional view of a conventional touch panel.
Figure 5:
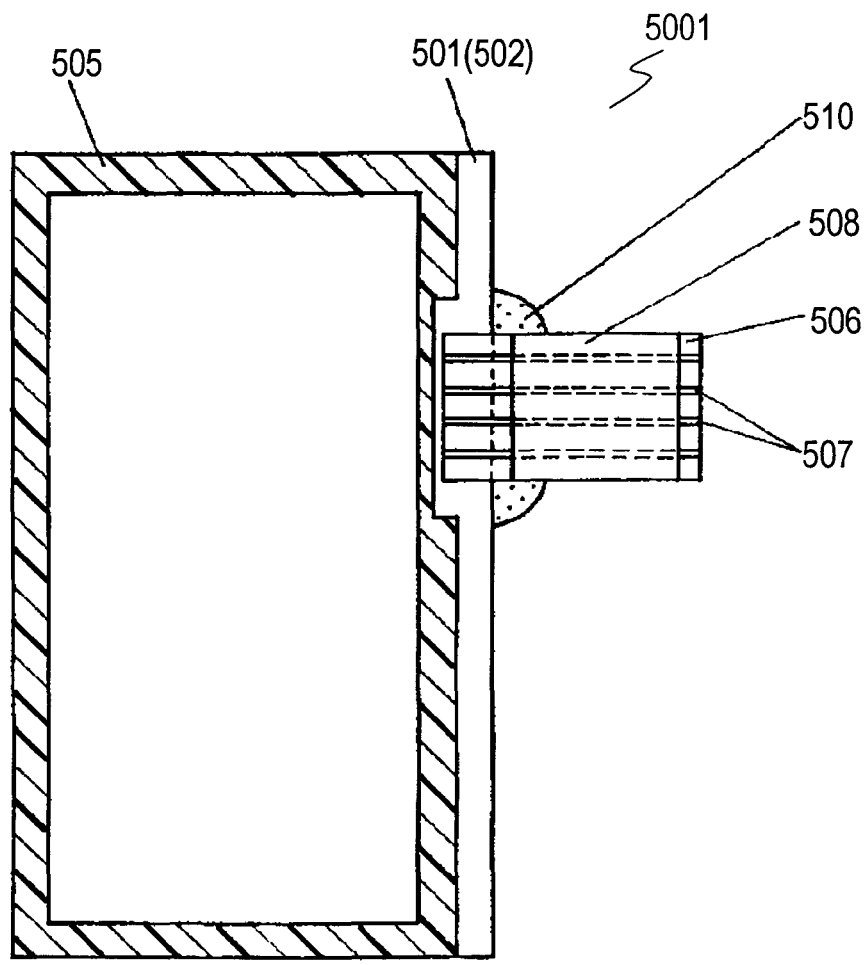
FIG. 5 is a plane sectional view of the conventional touch panel.

FIG. 3 is a side sectional view of another touch panel 1002 according to the embodiment. In FIG. 3, the same components as those of the touch panel shown in FIGS. 1 and 2 are denoted by the same reference numerals, and their description will be omitted. In touch panel 1002, an end of lower board 2 and portion P1 of cover sheet 18 expose from an end of upper board 1. Cover sheet 18 extends to above upper surface 2A of lower board 2. Adhesive 25 made of material identical to that of adhesive 10 is applied between upper board 1 and wiring board 16 to allow upper board 1 to adhere and fix to wiring board 16. This structure prevents wiring pattern 17 from having a crack or breakage at portion P1 of wiring board 16 in direction D3 even when wiring board 16 is bent in direction D4 to upper board 1

Touch panels 1001 and 1002 according to the embodiment include wiring patterns 17 only on lower surface 16B of wiring board 16. A wiring pattern and a cover sheet for covering the wiring pattern may be provided on upper surface 16A of wiring board 16 or on each of upper surface 16A and lower surface 16B. The cover sheet extends, similarly to cover sheet 18, to an inside beyond end 1C of upper board 1 or beyond respective ends 1C and 2C of upper board 1 and lower board 2, thereby providing the same effects.

Each of touch panels 1001 and 1002 includes cover sheet 18 having the film shape adhering to wiring board 16. Cover sheet 18 may be formed on upper surface 16A or lower surface 16B of wiring board 16 by printing resin, such as polyester or epoxy, on wiring board 16.

What is claimed is:

1. A touch panel comprising:
 a light-transmissible upper board having an upper surface and a lower surface;
 a lower board having an upper surface and a lower surface;
 an upper resistor layer provided on the lower surface of the upper board;
 a lower resistor layer provided on the upper surface of the lower board, the lower resistor layer facing the upper resistor layer with a predetermined space between the upper resistor layer and the lower resistor layer;
 a wiring board having an upper surface, a lower surface opposite to the upper surface and an end, the end being located between the upper board and the lower board;
 a plurality of wiring patterns provided on the lower surface of the wiring board, the plurality of wiring patterns being connected to the upper resistor layer and the lower resistor layer, respectively;
 an insulating cover sheet provided on the wiring board, the cover sheet covering the plurality of wiring patterns and extending to an inside beyond an end of the lower board, the insulating cover sheet contacting the upper surface of the lower board; and
 a first adhesive for allowing the upper board to adhere to the wiring board, the first adhesive being disposed on the upper surface of the wiring board.

2. The touch panel according to claim 1, further comprising a second adhesive for allowing the lower board to adhere to the wiring board.

3. The touch panel according to claim 1, wherein the cover sheet has a film shape.

4. The touch panel according to claim 1, wherein the first adhesive is made of silicone, chloroprene, urethane, acryl or mixture thereof.

5. The touch panel according to claim 2, wherein the second adhesive is made of silicone, chloroprene, urethane, acryl or mixture thereof.

6. The touch panel according to claim 1, wherein the cover sheet contacts the upper surface of the lower board at an edge of the lower board.

7. The touch panel according to claim 1, wherein the cover sheet contacts the lower board from an edge of the lower board continuously to an edge of the cover sheet.

* * * * *